United States Patent [19]

Brown et al.

[11] Patent Number: 4,506,218
[45] Date of Patent: Mar. 19, 1985

[54] CONDITION SENSING ARRANGEMENT FOR AC MACHINES

[75] Inventors: Fred A. Brown; Alan F. Grouse, both of Woodstock, N.Y.

[73] Assignee: Rotron Incorporated, Woodstock, N.Y.

[21] Appl. No.: 224,126

[22] Filed: Jan. 12, 1981

[51] Int. Cl.³ .................. G01R 31/02; G08B 21/00
[52] U.S. Cl. .................. 324/158 MG; 324/117 H; 340/648; 361/23
[58] Field of Search .......... 324/158 MG, 251, 117 H; 340/648; 361/23; 318/490; 310/68 R, 68 B, 68 C

[56] References Cited

U.S. PATENT DOCUMENTS

| | | |
|---|---|---|
| 1,522,196 | 1/1925 | MacMillan . |
| 2,754,464 | 7/1956 | Wizenez . |
| 2,939,074 | 5/1960 | Perrett . |
| 3,018,395 | 1/1962 | Carlstein . |
| 3,123,725 | 3/1964 | Nieda . |
| 3,373,300 | 3/1968 | Sullivan . |
| 3,404,339 | 10/1968 | Mitchell . |
| 3,506,914 | 4/1970 | Albright et al. . |
| 3,603,869 | 9/1971 | Neuffer et al. . |
| 3,624,504 | 11/1971 | Joly . |
| 3,751,691 | 8/1973 | Ellis, Jr. . |
| 3,855,529 | 12/1974 | Langweiler . |
| 3,943,504 | 3/1976 | Vosicky . |
| 4,086,519 | 4/1978 | Persson . |
| 4,099,104 | 7/1978 | Muller . |
| 4,136,312 | 1/1979 | Salon et al. . |
| 4,164,705 | 8/1979 | Whitney et al. . |
| 4,204,158 | 5/1980 | Ricouard et al. . |
| 4,230,961 | 10/1980 | Calfo et al. . |
| 4,296,410 | 10/1981 | Higgs et al. .................. 324/251 |

FOREIGN PATENT DOCUMENTS

| | | |
|---|---|---|
| 1258160 | 1/1964 | Fed. Rep. of Germany . |
| 82063 | 6/1980 | Japan .................. 324/158 MG |
| 1436716 | 5/1976 | United Kingdom . |

OTHER PUBLICATIONS

Sprague Interim Bulletin, "Type UGN-3013T Solid-State Ultra Low-Cost Hall Effect Digital Switches", Oct. 2, 1978.

Primary Examiner—Ernest F. Karlsen
Attorney, Agent, or Firm—Brumbaugh, Graves, Donohue & Raymond

[57] ABSTRACT

An arrangement for sensing the operating condition of an alternating current machine employs a Hall switch on the stator which is subjected to the alternating magnetic field established during operation. The Hall switch has a magnetic field strength threshhold below which it will not be actuated. During normal operation of the machine, the alternating field strength will cyclically exceed the switch threshhold, thereby generating a series of pulses at the frequency of alternation of the field. Should the field strength decrease as a result of overload of the machine, a decrease in line voltage, or the like, to a level below the threshhold level of the switch, the pulse output of the switch will cease. Circuitry responsive to the absence of periodic pulses actuates an indicator circuit to warn of the faulty operation.

12 Claims, 7 Drawing Figures

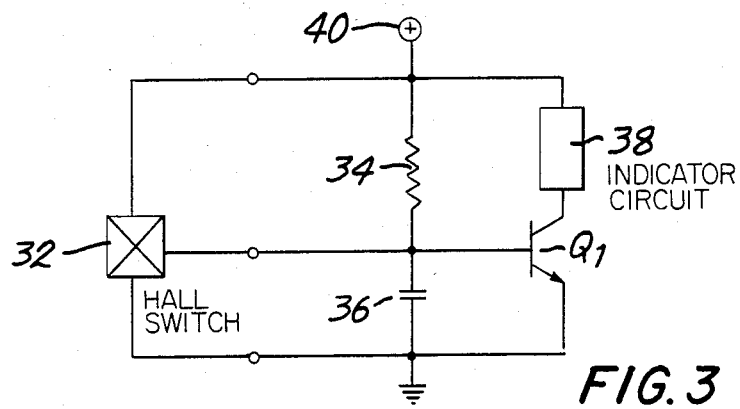
FIG. 3
FIG. 3A
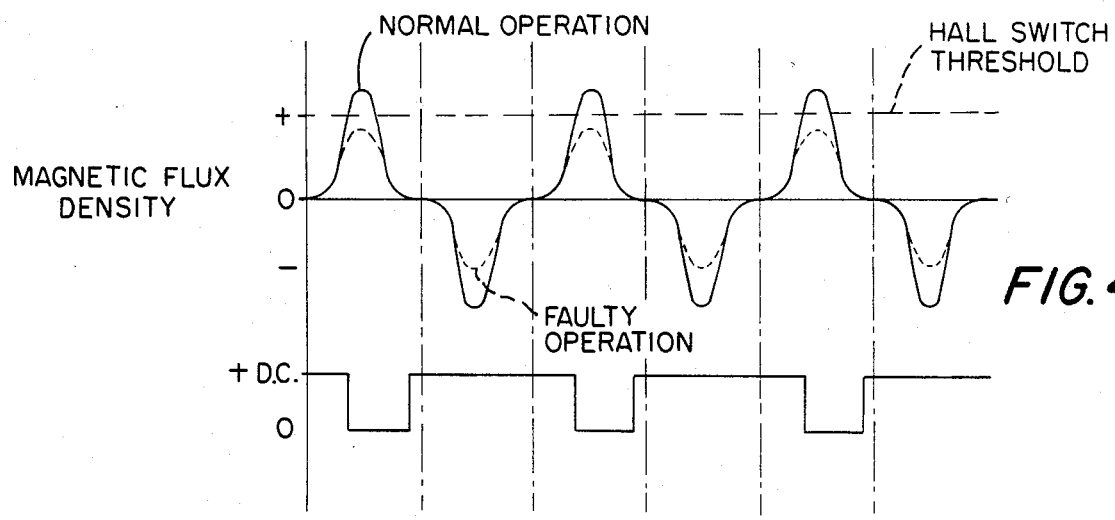
FIG. 4
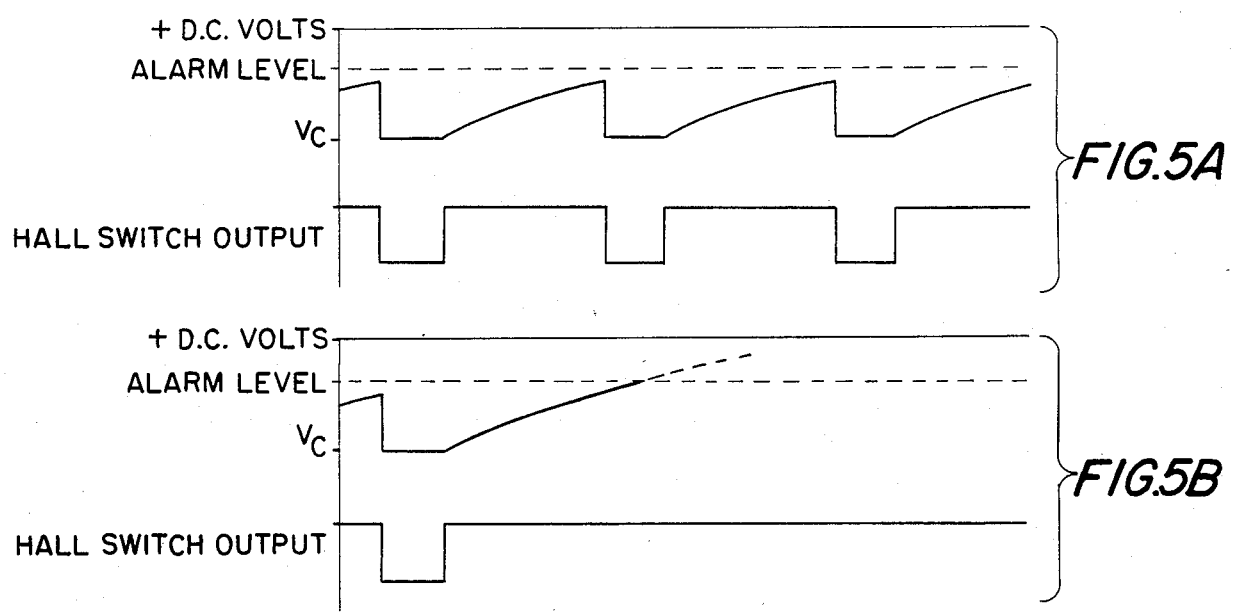
FIG. 5A
FIG. 5B

CONDITION SENSING ARRANGEMENT FOR AC MACHINES

This invention relates to condition sensing arrangements for dynamoelectric machines and, more particularly, to circuit means for sensing an operating condition of an alternating current machine and providing an output indicative of the condition.

BACKGROUND OF THE INVENTION

In many applications, it is desirable, if not necessary, to monitor the operation of an alternating current dynamooelectric machine, such as a motor, to ensure that the motor is performing its functions properly and within normal operating ranges. For example, in modern high-density electronic circuitry for computers and the like, motor driven fans are employed to keep the termperature of the components within safe ranges. In some types of electronic equipment, the fans are positioned such that their operating condition is not readily observable, either visually or by sensing a flow of air; in others, where large racks of equipment are concentrated, such as in telephone switching centers, personnel are not available to make the requisite checks on the condition of the cooling equipment and failure of the latter will be evidenced only by breakdown of the switching apparatus.

A number of different expedients have been resorted to to provide an indication of whether or not a motor is operating. One such arrangement incorporates a magnet fixed to the rotor for rotation therewith and a magnetic sensing element, such as a Hall effect device, mounted on the stator such that each revolution of the rotor produces an output from the Hall device. The Hall device output is converted to a series of electrical pulses, the frequency of which is directly related to the speed of rotation of the motor. Pulse counting circuitry then converts the pulse frequency into a speed indication to inform any observer of the motor operation. This system has the drawback of requiring a separate magnet on the rotor which, especially in the case of small motors, introduces a balance problem and, further, requires relatively complex circuitry to perform the pulse counting and indicating functions.

Another type of sensing system, specifically adapted to fans, employs a vane or air movement responsive device in the path of the air flow. The vane is coupled to a switch which, in turn, is in circuit with a power supply and indicator. As long as air flow is above a minimum level, the vane is deflected to keep the switch open. Upon cessation of air flow, the switch closes and an alarm signal is given. This system, besides being applicable only to motor driven fans, is relatively cumbersome in that it requires external mechanical and electrical apparatus outside of the fan unit itself and, moreover, indicates only when the fan has essentially come to a complete stop, by which time it may be too late to avoid damage to the equipment being cooled.

SUMMARY OF THE INVENTION

The present invention affords simple, reliable means for providing an indication of the operating condition of an alternating current machine which avoids the shortcomings of the prior art systems described above. The arrangement of the invention requires no addition to the rotor structure, thereby avoiding balance problems, and requires only simple indicating and/or control circuitry which may be internal or external of the motor. Moreover, since it senses an operating condition in the motor, its applicability is not limited to motor driven air moving devices.

In accordance with the invention, the magnetic field strength or flux density established in an alternating current machine is sensed by a magnetic field responsive device, such as a Hall effect switch, and a decrease in that magnetic field strength below a level, indicating faulty operation of the machine, is sensed and converted to an alarm indication or control function. Since the magnetic field is alternating in direction, the Hall effect switch will produce one pulse for each cycle of applied alternating current, e.g., 60 Hz, providing the magnitude of the magnetic field exceeds the threshold sensing level of the switch. Simple sensing circuitry, responsive to the constant 60 pulse per second repetition rate, provides an output signal which indicates the operating condition of the motor. Because it is magnetic field rather than speed responsive, the sensing arrangement will also operate properly if the same motor is powered at a different frequency within its operating range, e.g. 50 Hz.

Should the magnetic flux density of the field drop below the threshhold sensing level of the Hall effect switch, such as would occur if the motor were overloaded and, therefore, appreciably slowed down or if the applied voltage decreased or in the case of an open stator winding, the 60 p.p.s. pulse train would no longer be produced, thereby signalling faulty operation of the motor. By appropriate adjustment of the indicating circuitry and placement of the Hall effect switch, the threshhold sensing level may be selected to provide a fault indication in advance of actual failure of the machine.

BRIEF DESCRIPTION OF THE DRAWINGS

The features of the invention will be more readily apparent from the following detailed description thereof when taken in conjunction with the appended drawings, in which:

FIG. 3 is a schematic diagram of the electrical circuit of the invention;

FIG. 3A is a circuit diagram of a portion of the circuit of FIG. 3;

FIG. 4 is a wave form diagram useful in understanding the operation of the invention;

FIGS. 5A and 5B are wave form diagrams illustrating the operation of the indicating circuitry of FIGS. 3 and 3A.

DETAILED DESCRIPTION OF THE INVENTION

The drawings illustrate the preferred form of the invention used in connection with a conventional AC motor of the permanent split capacitor type. It will be understood, of course, that the invention may be applied to any type of alternating current machine in which an alternating current magnetic field is established at the standard line frequency or a multiple thereof.

Figure 1:
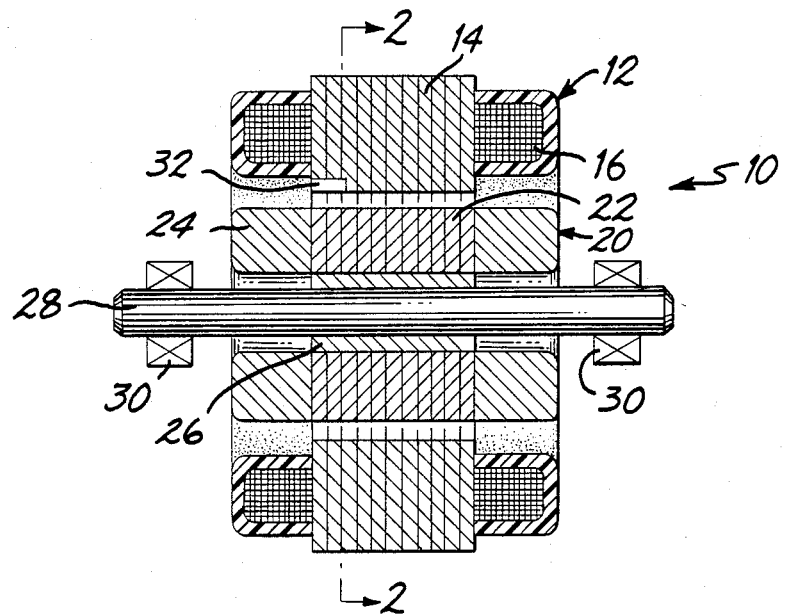
FIG. 1 is a cross-sectional view through a typical alternating current motor to which the invention may be applied.
Figure 2:
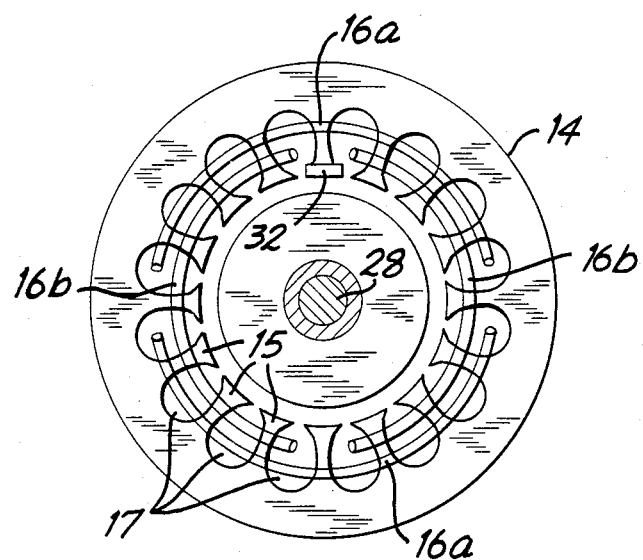
FIG. 2 is a cross-section taken along the lines 2—2 of FIG. 1.

Referring now particularly to FIGS. 1 and 2, a typical motor of the split capacitor type 10 includes a stator assembly 12 and a rotor assembly 20. The stator assembly includes a stack of stator laminations 14 which make up what is referred to as the stator iron, and the stator windings shown diagrammatically as 16, which are coupled, by leads not shown, to a source of alternating current at line frequency (e.g., 60 Hz) in conventional fashion.

The rotor assembly 20 includes the customary stack of laminations 22, formed with slots for accommodating the rotor windings or bars. The laminations, together with the end turns 24, which may be continuations of individual wires laid in the slots in the laminations, or cast of a metal, such as aluminium, integrally with the rotor bars, form the familiar squirrel cage rotor.

The rotor laminations and end turns assembly is fixed by means of a spacer 26 to a shaft 28. The latter is journalled in the frame of the motor (not shown) in bearings 30, which may be of any conventional type.

Turning to FIG. 2, in the example shown, the stator laminations 14 are formed with a plurality of pole faces 15 separated by slots 17 for accommodating the stator windings. Although, in the embodiment shown, the lamination 14 is formed with a plurality of separate pole faces 15 and slots 17 to allow it to be wound in various multiple configuration, the windings shown schematically at 16a and 16b are positioned so as to provide a two-pole configuration. Thus, the principal winding 16a and the auxiliary winding 16b are phase displaced 90° from one another. The motor capacitor (not shown) is connected in series with the auxiliary winding 16b and the capacitor-auxiliary winding combination connected in parallel with the main winding and the AC source. This produces two rotating magnetic fields out of phase with one another, which ensures proper starting and operation of the motor.

All of the foregoing is conventional motor technology and forms no part of the present invention.

According to the present invention, means are provided on the stator structure to sense the magnetic field generated by the stator windings upon energization by the AC source. In the preferred embodiment, the sensing means is a commercially available Hall effect switch such as the type manufactured by the Sprague Electric Company of Worcester, Mass. (Semiconductor Division) and identified as the UGN-3013T Solid State Hall Effect Digital Switch. This device consists of a silicon Hall cell which produces an electrical output of an amplitude dependent upon the magnetic field strength to which it is exposed, and amplifier, trigger and output stages integrated with the Hall cell onto a single chip. The circuit operates as a switch, turning on when the magnetic field strength reaches a predetermined threshold level and turning off when the magnetic field strength drops below a release level which is somewhat lower than the operating threshold level.

FIG. 3 is a schematic diagram of a simple alarm circuit in accordance with the invention. The Hall effect switch 32 has its power supply leads connected between the positive terminal 40 of a DC power supply and ground. Its output terminal is connected to the junction of a resistor 34 and capacitor 36, connected in series between the DC supply and ground. A transistor Q1 of the NPN type has its emitter connected to ground and its collector connected through an indicator circuit represented by the numeral 38 to the positive terminal 40 of the DC power supply. The base of the transistor Q1 is coupled to the junction of resistor 34 and capacitor 36.

Operation of the circuit of FIG. 3 will be described in conjunction with the wave forms of FIGS. 4, 5A and 5B. Referring first to the upper wave form in FIG. 4, the solid line curve represents the value of magnetic flux density established by the stator structure of the motor when alternating current is applied to the principal winding 16a. The alternating current power supply would be that normally available, e.g., 60 Hz, and the magnetic flux generated in the motor would alternate in polarity at the same frequency. The Hall effect switch 32 mounted on the stator structure is thus exposed to the alternating magnetic field in the air gap between the rotor and stator, as illustrated in FIG. 4.

Since the Hall effect device in the switch 32 is responsive to magnetic flux of a single polarity, the Hall effect switch may be actuated only when the alternating flux cycles of a given polarity exceed the Hall switch threshold level. Thus, as shown in FIG. 4, the Hall switch will be actuated each time the positive going magnetic field strength exceeds its threshhold level and will be turned off later during that same half-cycle when the magnetic flux density drops to the Hall switch release level. The result is a series of periodic pulses as shown in the lower wave form of FIG. 4. The periodicity of these pulses will always be the same as the alternating current supply, e.g., 60 Hz, as long as a predetermined level of flux density is maintained in the motor.

Turning now to FIGS. 5A and 5B, the dotted line, designated "alarm level", represents the voltage at the base of transistor Q1 required to switch it to conducting condition. During normal operation of the motor, the Hall switch 32 is actuated once each cycle of the applied AC power to drop the voltage at its output terminal from the DC power supply level to ground. When the Hall switch is so actuated, the capacitor 36 discharges rapidly to ground through the switch. When the Hall switch is subsequently turned off, the capacitor 36 begins to charge through resistor 34 towards the positive DC level. The time constant of the resistor-capacitor combination is selected such that the voltage across the capacitor 36 will not reach the alarm level, or switch on voltage of the transistor Q1, if the Hall switch is actuated during the next positive going cycle. Thus, during normal operation of the motor, the voltage across capacitor 36 will never reach the switching voltage of transistor Q1 and the indicator circuit 38 will not be actuated.

Should the magnetic field strength to which the Hall effect switch is exposed decrease such that the positive going excursions fall below the Hall switch threshhold, as shown in dotted form in FIG. 4, the Hall switch output remains at its positive DC level, as seen in FIG. 5B. This allows charging of the capacitor 36 towards the DC voltage supply level and, consequently, the voltage across the capacitor to reach the alarm level, thereby switching transistor Q1 to its conducting state. This, in turn, actuates the indicator circuit 38.

As will be appreciated, by appropriate selection of the values of resistor 34 and capacitor 36, a desired time delay for actuation of the transistor Q1 and indicator 38 may be selected. Thus, a suitable time delay may be provided to avoid a malfunction indication during start up, i.e., before the motor has reached its full operating speed, and also to bridge short periods of improper operation such as might be occasioned by short voltage interruptions and the like.

The indicator 38 may take various forms depending upon the environment in which the motor is used. In a simple form, it may consist simply of a resistor 42 in series with a light emitting diode (LED) 44, as shown in FIG. 3A, such that upon conduction of the transistor Q1, a visible light will appear to apprise the observer of the faulty operation. Alternatively, the indicator 38 may be of a more sophisticated nature, capable of producing an alarm indication at a point remote from the motor, such as over a wire or radio link.

As indicated above, the sensing arrangement of the present invention is responsive to the alternating magnetic field established in the motor rather than its speed of rotation, so that simple indicating circuitry may be employed to warn of an impending fault. Moreover, the circuitry may be readily adjusted to control the sensitivity of the system to allow for momentary overloads or voltage fluctuations where desired. Since the Hall effect switch is physically small (approximately 4½ mm square by 2 mm thick) it may be readily received in the stator structure of the machine without substantial structural modification or interference with its operation. This enhances its ability to be located at any convenient place on the stator, as long as it will be subjected to the alternating magnetic field at sufficient strength to allow it to switch properly.

It will also be recognized that various forms of indicator circuits to be actuated by the Hall switch output may be employed in accordance with the invention. Various types of integrated circuit chips may be used to actuate indicators, such as LEDs, to indicate faulty operation, as shown in the above described example. Alternatively, operation of the light may indicate normal operation of the motor, extinguishing of the light thus indicating a fault.

It will be apparent from the foregoing that many modifications of the arrangement of the invention will occur to those skilled in the art without departing from the inventive concepts described herein and the scope of the invention is to be limited only by the appended claims.

We claim:

1. The combination of an alternating current dynamoelectric machine and operation monitoring circuit,
    the dynamoelectric machine including a stator with at least one winding adapted to conduct alternating current, a rotor, opposed generally cylindrical surfaces on the stator and the rotor separated by an air gap, and the air gap bridged by an alternating magnetic field established when the stator winding is conducting, the alternating magnetic field in the air gap having an amplitude that decreases by reason of any one of several flux reducing faulty conditions;
    the operation monitoring circuit including air gap magnetic flux level sensing means and means connected thereto for producing an alarm output;
    said flux level sensing means and said means for producing an alarm output being connected in cooperative relationship to define a predetermined flux alarm level, said means for producing an output comprising means for causing a change in an output condition of the operation monitoring circuit when air gap flux detected by the sensing means falls below said flux alarm level and independent of comparison with any further air gap flux indication.

2. The apparatus of claim 1 wherein said magnetic flux level sensing means comprises a Hall effect switch.

3. The apparatus of claim 2 wherein said Hall effect switch is imbedded in said stator.

4. The apparatus of claim 1 wherein said magnetic flux level sensing means is mounted to be at the cylindrical surface of said stator so as to be subjected to the alternating magnetic field bridging said air gap when alternating current is supplied to said stator winding.

5. The apparatus of claim 2 wherein said Hall effect switch is responsive to alternations of only one polarity of the alternating magnetic field to generate a pulse for each such alternation exceeding said predetermined flux alarm level.

6. The apparatus of claim 5 wherein said means for producing an alarm output comprises means responsive to a substantially uninterrupted train of pulses from said Hall effect switch to produce an output voltage and indicator means responsive to the absence of said output voltage.

7. The apparatus of claim 6 wherein said pulse responsive means comprises a resistance-capacitance circuit.

8. The apparatus of claim 6 wherein said indicator means comprises a light emitting diode.

9. The combination according to claim 1 wherein the means for producing an alarm output comprises means responsive to a flux indication of the sensing means to determine when the flux has fallen below the predetermined level.

10. Apparatus for sensing and signaling improper motor operation of an alternating current fan motor having a stator with a winding adapted to conduct alternating current and a rotor, said stator and rotor having opposed, generally cylindrical surfaces separated by an air gap bridged by the alternating magnetic field established when said stator winding is conducting, said apparatus comprising;
    a detector means, at a detection location fixed with respect to the stator at said air gap, responsive to a magnetic field to provide a first voltage in the presence of a magnetic field of at least a predetermined magnitude at said detection location and a second voltage different from said first when said magnetic field is of a lower magnitude at said detection location,
    circuit means coupled to said detector means and responsive to said second voltage and independent of any further flux responsive signal representative of flux level at any further air gap location fixed with respect to the stator to produce an output indicating improper motor operation producing reduced air gap flux at said detection location,
    and an indicator actuated by said output indicating improper motor operation.

11. Apparatus for sensing and signaling improper motor operation of an alternating current motor having a stator with at least one winding adapted to conduct alternating current and a rotor, said stator and rotor having opposed surfaces separated by an air gap bridged by the alternating magnetic field as established when said stator winding is conducting; said apparatus comprising switching means for switching between first and second conditions and connected to an alarm output, means connected to the switching means in controlling relation thereto for changing the switching condition thereof, detector means, one location fixed with respect to the stator at said air gap, and connected to the means in controlling relation to the switching means and providing a voltage level to the means in controlling relation to the switching means indicative of the flux level at only the one location to cause said means in controlling relation to change the condition of said switching means in response to a drop in the air gap flux described at only the one location indicating faulty motor operation.

12. The apparatus according to claim 11 wherein the switching means includes a transistor, the means in controlling relation to the switching means includes a capacitor, the detector means includes means for producing a series of pulses when the air gap flux level is above a predetermined level, said pulses controlling the charge on said capacitor and thereby controlling the bias of the transistor to change the switching condition thereof.

* * * * *